United States Patent
Cheng

(10) Patent No.: US 11,854,604 B2
(45) Date of Patent: Dec. 26, 2023

(54) SENSE AMPLIFIER, CONTROL METHOD OF SENSE AMPLIFIER, AND EQUIPMENT

(71) Applicant: CHANGXIN MEMORY TECHNOLOGIES, INC., Hefei (CN)

(72) Inventor: Weijie Cheng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 244 days.

(21) Appl. No.: 17/442,364

(22) PCT Filed: Jun. 30, 2021

(86) PCT No.: PCT/CN2021/103470
§ 371 (c)(1),
(2) Date: Sep. 23, 2021

(87) PCT Pub. No.: WO2022/147981
PCT Pub. Date: Jul. 14, 2022

(65) Prior Publication Data
US 2023/0066099 A1   Mar. 2, 2023

(30) Foreign Application Priority Data

Jan. 5, 2021   (CN) .................. 202110009952.X

(51) Int. Cl.
*G11C 16/04*   (2006.01)
*G11C 11/4091*   (2006.01)
*G11C 11/408*   (2006.01)
*G11C 11/4094*   (2006.01)

(52) U.S. Cl.
CPC ...... *G11C 11/4091* (2013.01); *G11C 11/4085* (2013.01); *G11C 11/4094* (2013.01)

(58) Field of Classification Search
CPC ............ G11C 11/4091; G11C 11/4085; G11C 11/4094; G11C 7/065; G11C 5/147; G11C 7/08; G11C 11/4097
USPC .................................................. 365/185.21
See application file for complete search history.

(56) References Cited

U.S. PATENT DOCUMENTS

| 8,233,343 | B2 | 7/2012 | Moon |
| 8,345,498 | B2 | 1/2013 | Romanovskyy et al. |
| 9,202,531 | B2 | 12/2015 | Seo |
| 10,839,873 | B1* | 11/2020 | Lee ...................... G11C 7/1048 |

(Continued)

FOREIGN PATENT DOCUMENTS

| CN | 101937701 A | 1/2011 |
| CN | 102646444 A | 8/2012 |

(Continued)

OTHER PUBLICATIONS

International Search Report cited in PCT/CN2021/103470 dated Oct. 8, 2021, 11 pages.

*Primary Examiner* — Tha-O H Bui
(74) *Attorney, Agent, or Firm* — Cooper Legal Group, LLC

(57) ABSTRACT

A sense amplifier, a control method of the sense amplifier, and a memory are provided. The sense amplifier includes: a first power input terminal, a second power input terminal, a first switch transistor, a second switch transistor, a third switch transistor, a fourth switch transistor, a fifth switch transistor, a first negative-channel metal-oxide semiconductor (NMOS) transistor, a second NMOS transistor, a first positive-channel metal-oxide semiconductor (PMOS) transistor and a second PMOS transistor.

13 Claims, 6 Drawing Sheets

(56) References Cited

U.S. PATENT DOCUMENTS

| | | | |
|---|---|---|---|
| 10,902,889 B2* | 1/2021 | Oak | G11C 7/08 |
| 2008/0225616 A1 | 9/2008 | Cheng et al. | |
| 2018/0233192 A1* | 8/2018 | Won | G11C 7/08 |
| 2019/0007000 A1 | 1/2019 | Jeong et al. | |

FOREIGN PATENT DOCUMENTS

| | | |
|---|---|---|
| CN | 210575115 U | 5/2020 |
| CN | 111739566 A | 10/2020 |
| CN | 112712837 A | 4/2021 |

* cited by examiner

SENSE AMPLIFIER, CONTROL METHOD OF SENSE AMPLIFIER, AND EQUIPMENT

CROSS-REFERENCE TO RELATED APPLICATIONS

The present application is a national stage of International Patent Application No. PCT/CN2021/103470, filed on Jun. 30, 2021, which claims the priority to Chinese Patent Application No. 202110009952.X, titled "SENSE AMPLIFIER, CONTROL METHOD OF SENSE AMPLIFIER, AND MEMORY", filed with China National Intellectual Property Administration on Jan. 5, 2021. The entire contents of International Patent Application No. PCT/CN2021/103470 and Chinese Patent Application No. 202110009952.X are incorporated herein by reference.

TECHNICAL FIELD

The present disclosure relates to the technical field of semiconductor memories, and in particular to a sense amplifier, a control method of the sense amplifier, and a memory.

BACKGROUND

Among the memory devices, a dynamic random access memory (DRAM) operates by writing and reading data to and from a memory unit, which is connected to a bitline (BL) and a complementary bitline (BLB). The sense amplifier is widely used in various memory devices. When applied to the DRAM, the sense amplifier is turned on at an appropriate time point to amplify the weak voltage difference between the BL and the BLB, such that the data stored in the memory unit can be correctly read.

At present, as the supply voltage and device size of the DRAM are getting smaller, the sensing margin of the traditional sense amplifier gradually decreases. Meanwhile, since the devices of the sense amplifier may have different threshold voltages due to process and temperature changes, there is a threshold voltage mismatch between different devices, which may cause offset noise. Due to the gradual decrease of the sensing margin and the offset noise, it is likely to cause the problem of insufficient sensing margin, resulting in that the sense amplifier cannot amplify the signal quickly and effectively, thereby degrading the performance of the DRAM.

SUMMARY

A first aspect of the present disclosure provides a sense amplifier. The sense amplifier includes: a first power input terminal, a second power input terminal, a first switch transistor, a second switch transistor, a third switch transistor, a fourth switch transistor, a fifth switch transistor, a first negative-channel metal-oxide semiconductor (NMOS) transistor, a second NMOS transistor, a first positive-channel metal-oxide semiconductor (PMOS) transistor and a second PMOS transistor, where a source of the first PMOS transistor and a source of the second PMOS transistor are connected to the first power input terminal of the sense amplifier; a drain of the first PMOS transistor and a gate of the second PMOS transistor are connected to a sensing bitline (SABL); a gate of the first PMOS transistor and a drain of the second PMOS transistor are connected to a complementary sensing bitline (SABLB); a first terminal of the first switch transistor is connected to the SABL, a second terminal of the first switch transistor is connected to the SABLB, and a control terminal of the first switch transistor is connected to an equalization control signal; a first terminal of the second switch transistor is connected to a complementary bitline (BLB), a second terminal of the second switch transistor is connected to the SABL, and a control terminal of the second switch transistor is connected to a first control signal; a first terminal of the third switch transistor is connected to a bitline (BL), a second terminal of the third switch transistor is connected to the SABLB, and a control terminal of the third switch transistor is connected to a second control signal; a first terminal of the fourth switch transistor is connected to the SABL, a second terminal of the fourth switch transistor is connected to a drain of the first NMOS transistor, and a control terminal of the fourth switch transistor is connected to a third control signal; a first terminal of the fifth switch transistor is connected to the SABLB, a second terminal of the fifth switch transistor is connected to a drain of the second NMOS transistor, and a control terminal of the fifth switch transistor is connected to a fourth control signal; a source of the first NMOS transistor and a source of the second NMOS transistor are connected to the second power input terminal of the sense amplifier; a gate of the first NMOS transistor is connected to the BL, and a gate of the second NMOS transistor is connected to the BLB.

A second aspect of the present disclosure provides a control method of the sense amplifier. The control method sequentially includes a pre-charge stage, a first offset compensation stage, a second offset compensation and charge sharing stage, an equalization stage, a pre-sensing stage and a restoring stage in sequence, where the pre-charge stage includes: turning on the first switch transistor, the second switch transistor, the third switch transistor, the fourth switch transistor and the fifth switch transistor until a voltage on the BL, a voltage on the BLB, a voltage on the SABL and a voltage on the SABLB are equal to a bitline pre-charge voltage, so as to complete pre-charge; the first offset compensation stage includes: turning on the first switch transistor, the third switch transistor and the fourth switch transistor, and turning off the second switch transistor and the fifth switch transistor until the voltage on the BL is equal to the voltage on the SABL, so as to complete a first offset compensation; the second offset compensation and charge sharing stage includes: turning off the third switch transistor and the fourth switch transistor, and turning on the first switch transistor, the second switch transistor and the fifth switch transistor, until the voltage on the SABLB is equal to the voltage on the BLB, and the BL and a memory unit complete charge sharing, so as to complete a second offset compensation and charge sharing; the equalization stage includes: turning on the first switch transistor, the fourth switch transistor and the fifth switch transistor, and turning off the second switch transistor and the third switch transistor, until the voltage on the SABL is equal to the voltage on the SABLB, so as to complete equalization; the pre-sensing stage includes: turning on the fourth switch transistor and the fifth switch transistor, and turning off the first switch transistor, the second switch transistor and the third switch transistor, until the voltage on the SABL is pulled to be equal to a voltage on the second power input terminal and the voltage on the SABLB is pulled to be equal to a voltage on the first power input terminal, or until the voltage on the SABL is pulled to be equal to the voltage on the first power input terminal and the voltage on the SABLB is pulled to be equal to the voltage on the second power input terminal, so as to complete pre-sensing; the restoring stage includes: turning on the second switch transistor, the third switch transistor, the fourth switch transistor and the fifth switch transistor, and turning off the first switch transistor, until the voltage on the BL and the voltage on the SABLB are equal and are at a high level and the voltage on the BLB and the voltage on the SABL are equal and are at a low level, or until the voltage on the BL and the voltage on the SABLB are equal and are at a low level and the voltage on the BLB and the voltage on the SABL are equal and are at a high level, so as to reach a stable state to complete restoration.

A third aspect of the present disclosure provides a memory including the above-mentioned sense amplifier.

A fourth aspect of the present disclosure provides a computer equipment. The computer equipment includes a memory and a processor, where the memory stores a computer program, and the computer program is executed by the processor to implement the steps of the above-mentioned control method of the sense amplifier.

A fifth aspect of the present disclosure provides a computer-readable storage medium. The computer-readable storage medium stores a computer program, and the computer program is executed by a processor to implement the steps of the above-mentioned control method of the sense amplifier.

BRIEF DESCRIPTION OF THE DRAWINGS

In order to better describe and explain the embodiments of the present disclosure, one or more drawings may be referred to. However, the additional details or examples used to describe the drawings should not be considered as a limitation on the scope of any of the inventions of the present disclosure, the currently described embodiments or preferred modes.

DETAILED DESCRIPTION

Figure 1:
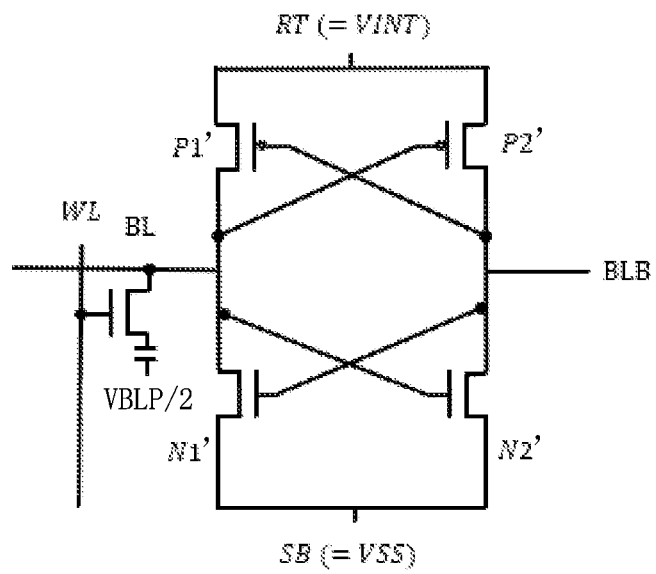
FIG. 1 is a circuit diagram of a sense amplifier.

In order to facilitate the understanding of the present disclosure, the present disclosure is described more completely below with reference to the drawings. The embodiments of the represent disclosure are shown in the drawings. However, the present disclosure may be embodied in various forms without being limited to the embodiments described herein. These embodiments are provided in order to make the present disclosure more thorough and comprehensive.

Unless otherwise defined, all technical and scientific terms used herein have the same meaning as commonly understood by those skilled in the technical field of the present disclosure. The terms mentioned herein are merely for the purpose of describing specific embodiments, rather than to limit the present disclosure.

It is understandable that the terms such as "first" and "second" used herein may be used to describe various elements, but these elements are not limited to these terms. Instead, these terms are merely intended to distinguish one element from another. For example, without departing from the scope of the present disclosure, a first power input terminal may be referred to as a second power input terminal, and similarly, a second power input terminal may be referred to as a first power input terminal. Both the first power input terminal and the second power input terminal are power input terminals, but they are not the same power input terminal.

It can be understood that "connection" in the following embodiments should be understood as "electrical connection" or "communication connection" if the connected circuits, modules or units have electrical signal or data transmission between each other.

In this specification, the singular forms of "a", "an" and "this" may also include plural forms, unless clearly indicated otherwise. It should also be understood that the terms such as "including/comprising" and "having" indicate the existence of the stated features, wholes, steps, operations, components, parts or combinations thereof. However, these terms do not exclude the possibility of the existence of one or more other features, wholes, steps, operations, components, parts or combinations thereof.

FIG. 1 shows a traditional sense amplifier. The sense amplifier includes a pair of negative-channel metal-oxide semiconductor (NMOS) transistors (a first NMOS transistor N1' and a second NMOS transistor N2') and a pair of positive-channel metal-oxide semiconductor (PMOS) transistors (a first PMOS transistor P1' and a second PMOS transistor P2') that are interactively coupled. A source of the first PMOS transistor P1' and a source of the second PMOS transistor P2' are connected to a first power input terminal RT' of the sense amplifier. A drain of the first PMOS transistor P1' and a gate of the second PMOS transistor P2' are connected to a bitline BL'. A gate of the first PMOS transistor P1' and a drain of the second PMOS transistor P2' are connected to a complementary bitline (BLB). A source of the first NMOS transistor N1' and a source of the second NMOS transistor N2' are connected to a second voltage input terminal SB' of the sense amplifier. A drain of the first NMOS transistor N1' and a gate of the second NMOS transistor NT are connected to the bitline BL'. A drain of the second NMOS transistor N' and a gate of the first NMOS transistor N1' are connected to the complementary bitline BLB'. The first NMOS transistor N1' and the second NMOS transistor N2' of the sense amplifier in FIG. 1 will have a threshold voltage mismatch due to process and temperature changes, and the threshold voltage mismatch of the first NMOS transistor N1' and the second NMOS transistor NT may cause offset noise. In addition, since the devices of the current sense amplifier may have different threshold voltages due to process and temperature changes, there is a threshold voltage mismatch between different devices, which may also cause offset noise. Due to the gradual decrease of the sensing margin and the existence of the offset noise, it is likely to cause the problem of insufficient sensing margin, resulting in that the sense amplifier cannot amplify the signal quickly and effectively, thereby degrading the performance of the dynamic random access memory (DRAM).

Figure 2:
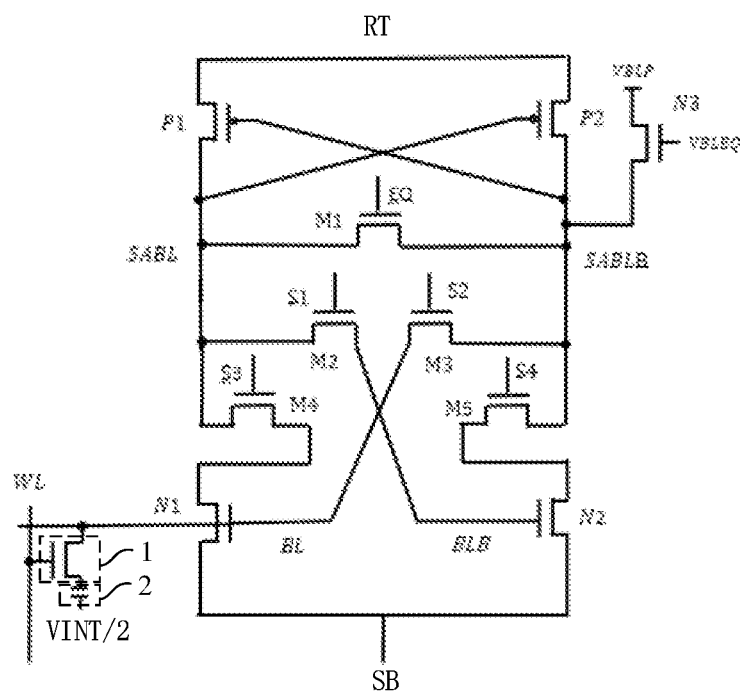
FIG. 2 is a circuit diagram of a sense amplifier according to an embodiment of the present disclosure.

Referring to FIG. 2, the present disclosure provides a sense amplifier. The sense amplifier includes: a first power input terminal RT, a second power input terminal SB, a first switch transistor M1, a second switch transistor M2, a third switch transistor M3, a fourth switch transistor M4, a fifth switch transistor M5, a first NMOS transistor N1, a second NMOS transistor N2, a first PMOS transistor P1 and a second PMOS transistor P2.

A source of the first PMOS transistor P1 and a source of the second PMOS transistor P2 are connected to the first power input terminal RT of the sense amplifier. A drain of the first PMOS transistor P1 and a gate of the second PMOS transistor P2 are connected to a sensing bitline (SABL). A gate of the first PMOS transistor P1 and a drain of the second PMOS transistor P2 are connected to a complementary sensing bitline (SABLB).

For the first switch transistor M1, a first terminal is connected to the SABL, a second terminal is connected to the SABLB, and a control terminal is connected to an equalization control signal EQ.

For the second switch transistor M2, a first terminal is connected to a complementary bitline (BLB), a second terminal is connected to the SABL, and a control terminal is connected to a first control signal S1.

For the third switch transistor M3, a first terminal is connected to a bitline (BL), a second terminal is connected to the SABLB, and a control terminal is connected to a second control signal S2.

For the fourth switch transistor M4, a first terminal is connected to the SABL, a second terminal is connected to a drain of the first NMOS transistor N1, and a control terminal is connected to a third control signal S3.

For the fifth switch transistor M5, a first terminal is connected to the SABLB, a second terminal is connected to a drain of the second NMOS transistor N2, and a control terminal is connected to a fourth control signal S4.

A source of the first NMOS transistor N1 and a source of the second NMOS transistor N2 are connected to the second power input terminal SB of the sense amplifier. A gate of the first NMOS transistor N1 is connected to the BL, and a gate of the second NMOS transistor N2 is connected to the BLB.

In the above-mentioned embodiment, when the sense amplifier operates, appropriate sequential logic signals are output to the five switch transistors M1, M2, M3, M4 and M5 respectively to control the on and off of the five switch transistors. This can eliminate the offset noise caused by the threshold voltage mismatch between the first NMOS transistor N1 and the second NMOS transistor N2, and increase the sensing margin of the sense amplifier. Thus, the sense amplifier can quickly and effectively amplify the signal, thereby solving the problem of insufficient sensing margin.

In some embodiments, each of the first switch transistor M1, the second switch transistor M2, the third switch transistor M3, the fourth switch transistor M4 and the fifth switch transistor M5 is an NMOS transistor. Each of the first terminal of the first switch transistor M1, the first terminal of the second switch transistor M2, the first terminal of the third switch transistor M3, the first terminal of the fourth switch transistor M4 and the first terminal of the fifth switch transistor M5 is a drain of an NMOS transistor. Each of the second terminal of the first switch transistor M1, the second terminal of the second switch transistor M2, the second terminal of the third switch transistor M3, the second terminal of the fourth switch transistor M4 and the second terminal of the fifth switch transistor M5 is a source of an NMOS transistor. Each of the control terminal of the first switch transistor M1, the control terminal of the second switch transistor M2, the control terminal of the third switch transistor M3, the control terminal of the fourth switch transistor M4 and the control terminal of the fifth switch transistor M5 is a gate of an NMOS transistor.

In some embodiments, the sense amplifier is connected to an energy storage unit 2 by a switch unit 1.

Specifically, as shown in FIG. 2, in some embodiments, the switch unit 1 includes a sixth switch transistor. A control terminal of the sixth switch transistor is connected to a wordline (WL), a first terminal of the sixth switch transistor is connected to the energy storage unit 2, and a second terminal of the sixth switch transistor is connected to the BL. In some embodiments, the sixth switch transistor includes an NMOS transistor. A drain of the sixth switch transistor is the first terminal of the sixth switch transistor, a source of the sixth switch transistor is the second terminal of the sixth switch transistor, and a gate of the sixth switch transistor is the control terminal of the sixth switch transistor.

In some embodiments, the energy storage unit 2 includes an energy storage capacitor.

In some embodiments, one terminal of the energy storage unit 2 is connected to an applied voltage, and the other terminal thereof is connected to the first terminal of the sixth switch transistor. Specifically, the applied voltage may be half of a supply voltage (VINT), or other value. This embodiment does not limit the value of the applied voltage.

In some embodiments, the sense amplifier provided by the present disclosure further includes a seventh switch transistor N3. A first terminal of the seventh switch transistor N3 is connected to a bitline pre-charge voltage VBLP, a second terminal of the seventh switch transistor N3 is connected to the SABLB, and a control terminal of the seventh switch transistor N3 is connected to a bitline equalization voltage VBLEQ.

Specifically, as shown in FIG. 2, in some embodiments, the seventh switch transistor N3 includes an NMOS transistor. A drain of the seventh switch transistor N3 is the first terminal of the seventh switch transistor N3, a source of the seventh switch transistor N3 is the second terminal of the seventh switch transistor N3, and a gate of the seventh switch transistor N3 is the control terminal of the seventh switch transistor N3.

Figure 3:
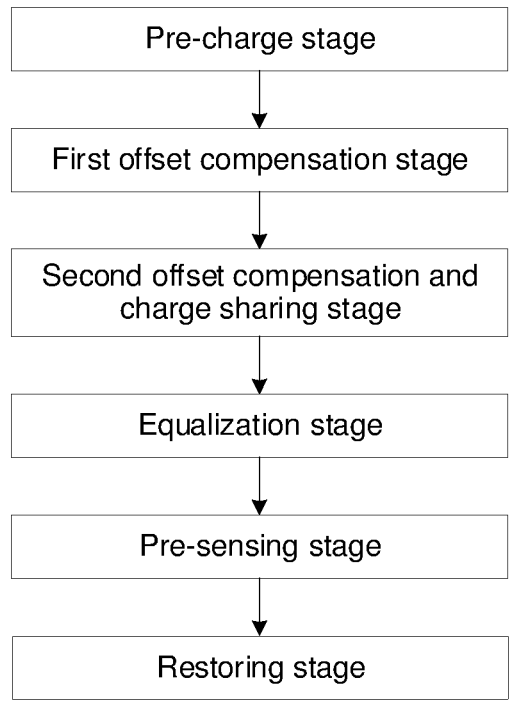
FIG. 3 is a flowchart of a control method of the sense amplifier according to an embodiment of the present disclosure.

Referring to FIG. 3, the present disclosure provides a control method of the sense amplifier. The control method includes a pre-charge stage, a first offset compensation stage, a second offset compensation and charge sharing stage, an equalization stage, a pre-sensing stage and a restoring stage in sequence. These stages are described in detail below.

Figure 4:
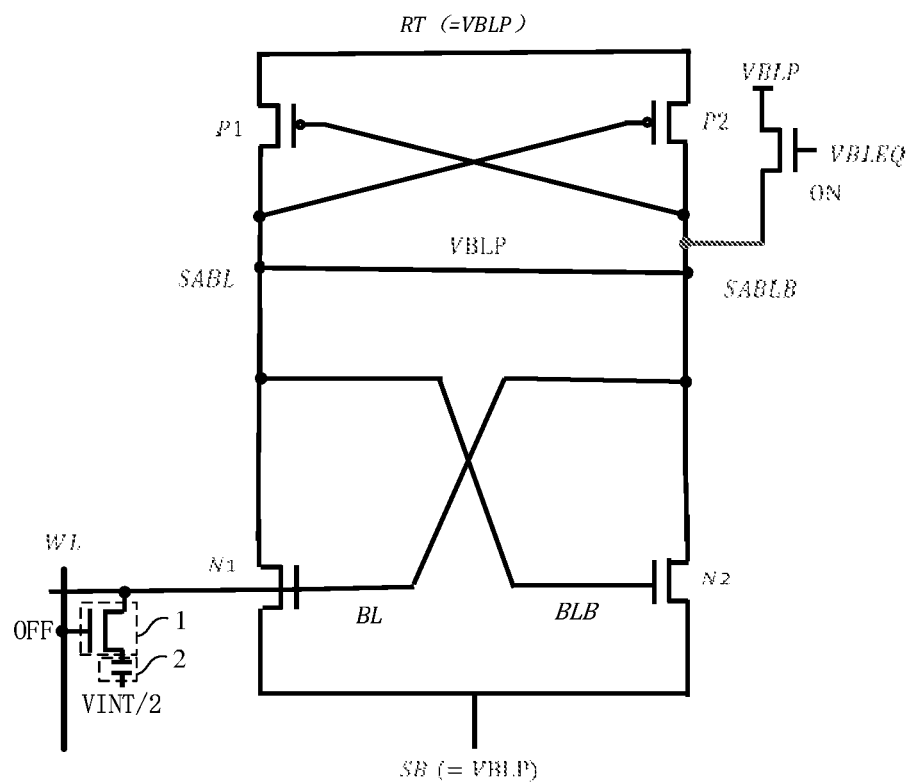
FIGS. 4 to 9 are equivalent circuit diagrams of the sense amplifier in different working states according to an embodiment of the present disclosure.

As shown in FIG. 4, the pre-charge stage includes: turn on the first switch transistor M1, the second switch transistor M2, the third switch transistor M3, the fourth switch transistor M4 and the fifth switch transistor M5 until a voltage on the BL, a voltage on the BLB, a voltage on the SABL and a voltage on the SABLB are equal to the bitline pre-charge voltage VBLP, so as to complete pre-charge. It should be noted that, in FIG. 4, closed circuits formed after the first switch transistor M1, the second switch transistor M2, the third switch transistor M3, the fourth switch transistor M4 and the fifth switch transistor M5 are turned on are indicated by solid lines. In the figure, the first switch transistor M1, the second switch transistor M2, the third switch transistor M3, the fourth switch transistor M4 and the fifth switch transistor M5 are omitted.

Figure 5:
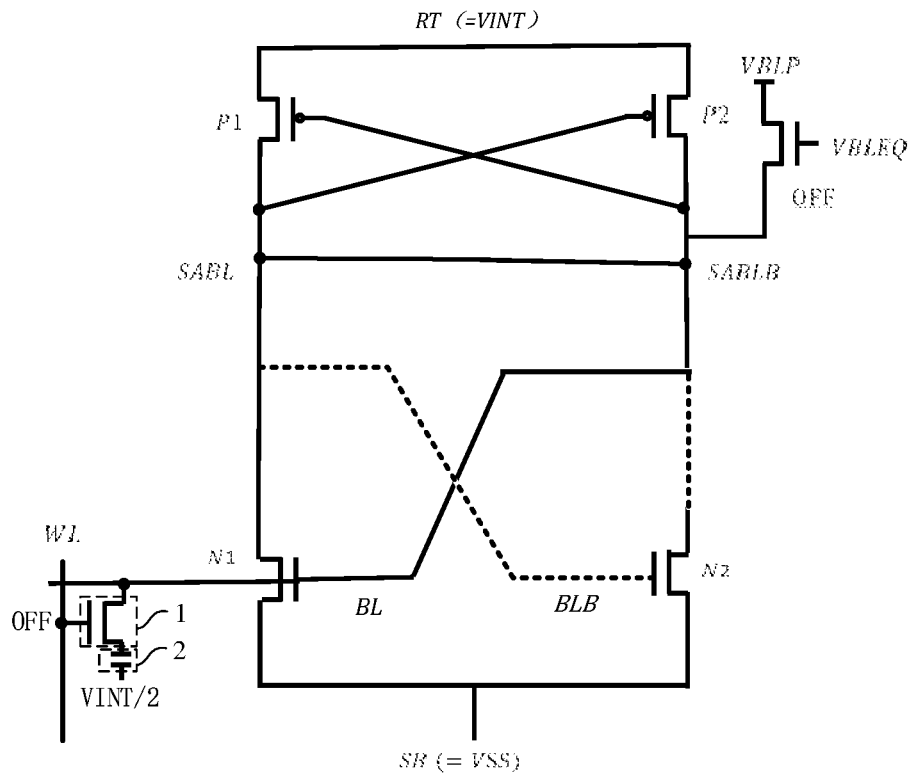

As shown in FIG. 5, the first offset compensation stage includes: turn on the first switch transistor M1, the third switch transistor M3 and the fourth switch transistor M4, and turn off the second switch transistor M2 and the fifth switch transistor M5 until the voltage on the BL is equal to the voltage on the SABL, so as to complete a first offset compensation. It should be noted that in FIG. 5, closed circuits formed by the first switch transistor M1, the third switch transistor M3 and the fourth switch transistor M4 are indicated by solid lines, and the first switch transistor M1, the third switch transistor M3 and the fourth switch transistor M4 are omitted. Open circuits formed after the second switch transistor M2 and the fifth switch transistor M5 are turned off are indicated by dotted lines, and the second switch transistor M2 and the fifth switch transistor M5 are omitted.

Figure 6:
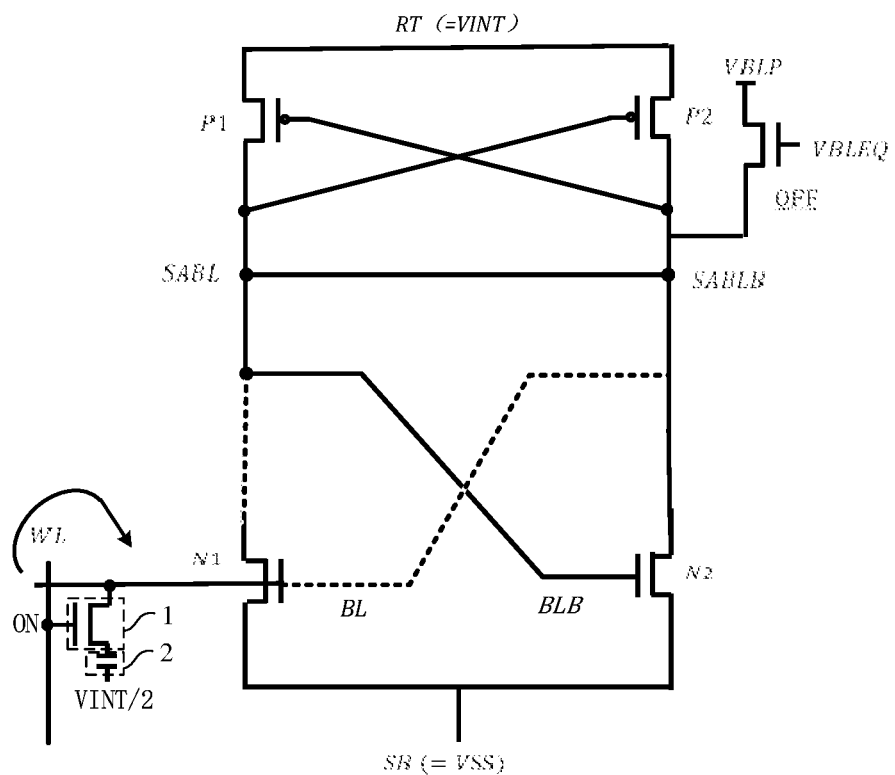

As shown in FIG. 6, the second offset compensation and charge sharing stage includes: turn off the third switch transistor M3 and the fourth switch transistor M4, and turn on the first switch transistor M1, the second switch transistor M2 and the fifth switch transistor M5, until the voltage on the SABLB is equal to the voltage on the BLB, and the BL and a memory unit complete charge sharing, so as to complete a second offset compensation and charge sharing. It should be noted that in FIG. 6, closed circuits formed after the first switch transistor M1, the second switch transistor M2 and the fifth switch transistor M5 are turned on are indicated by solid lines, and the first switch transistor M1, the second switch transistor M2 and the fifth switch transistor M5 are omitted. Open circuits formed after the third switch transistor M3 and the fourth switch transistor M4 are turned off are indicated by dotted lines, and the third switch transistor M3 and the fourth switch transistor M4 are omitted.

Figure 7:
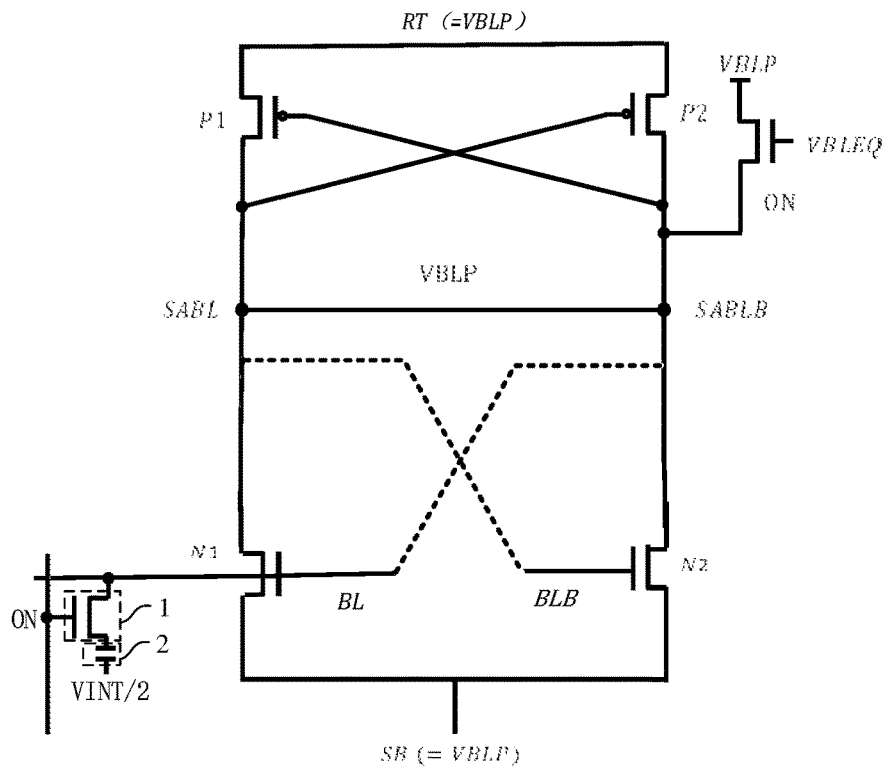

As shown in FIG. 7, the equalization stage includes: turn on the first switch transistor M1, the fourth switch transistor M4 and the fifth switch transistor M5, and turn off the second switch transistor M2 and the third switch transistor M3, until the voltage on the SABL is equal to the voltage on the SABLB, so as to complete equalization. It should be noted that in FIG. 7, closed circuits formed after the first switch transistor M1, the fourth switch transistor M4 and the fifth switch transistor M5 are turned on are indicated by solid lines, and the first switch transistor M1, the fourth switch transistor M4 and the fifth switch transistor M5 are omitted. Open circuits formed after the switch transistor M2 and the third switch transistor M3 are turned off are indicated by dotted lines, and the second switch transistor M2 and the third switch transistor M3 are omitted.

Figure 8:
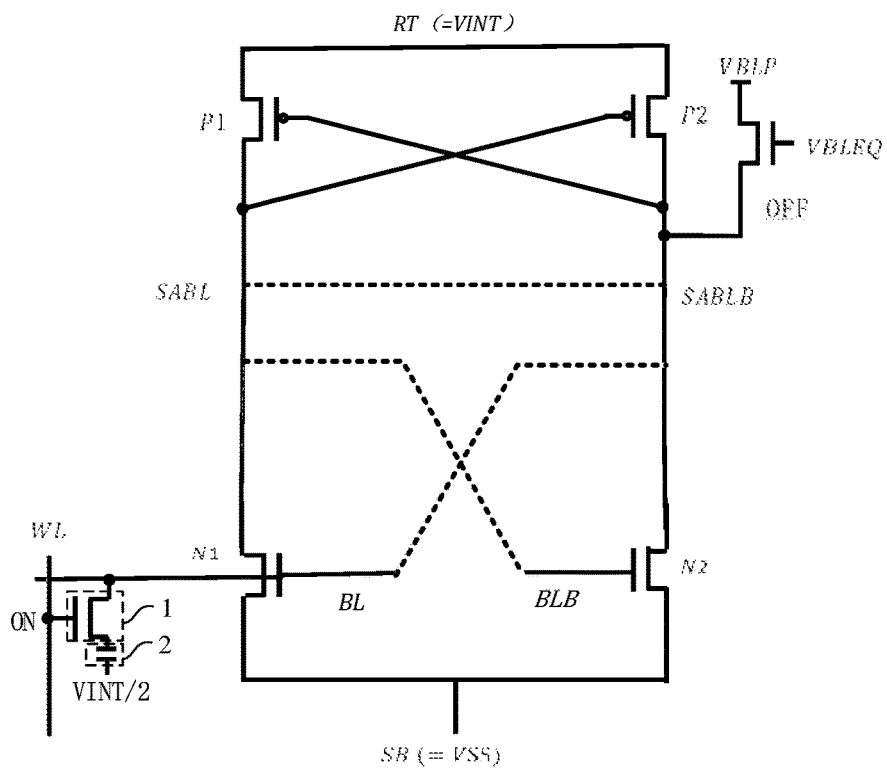

As shown in FIG. 8, the pre-sensing stage includes:
when a read "1" operation is performed: turn on the fourth switch transistor M4 and the fifth switch transistor M5, and turn off the first switch transistor M1, the second switch transistor M2 and the third switch transistor M3, until the voltage on the SABL is pulled to be equal to a voltage on the second power input terminal SB and the voltage on the SABLB is pulled to be equal to a voltage on the first power input terminal RT;
when a read "0" operation is performed: turn on the fourth switch transistor M4 and the fifth switch transistor M5, and turn off the first switch transistor M1, the second switch transistor M2 and the third switch transistor M3, until the voltage on the SABL is pulled to be equal to the voltage on the first power input terminal and the voltage on the SABLB is pulled to be equal to the voltage on the second power input terminal, so as to complete pre-sensing.

It should be noted that in FIG. 8, closed circuits formed after the fourth switch transistor M4 and the fifth switch transistor M5 are turned on are indicated by solid lines, and the fourth switch transistor M4 and the fifth switch transistor M5 are omitted. Open circuits formed after the first switch transistor M1, the second switch transistor M2 and the third switch transistor M3 are turned off are indicated by dotted lines, and the first switch transistor M1, the second switch transistor M2 and the third switch transistor M3 are omitted.

Figure 9:
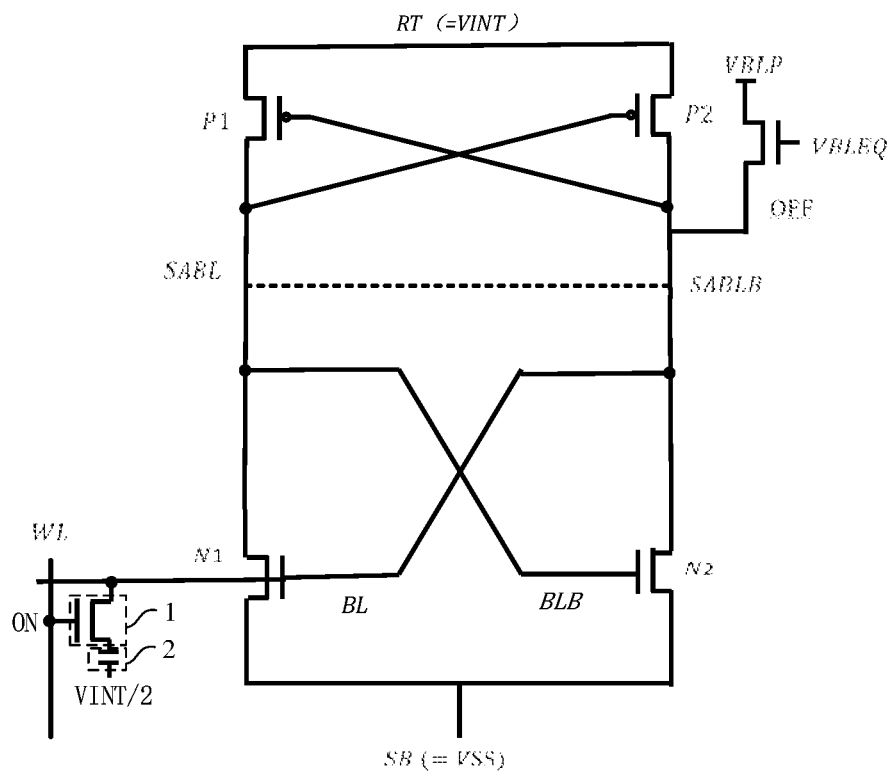

As shown in FIG. 9, the restoring stage includes:
when a read "1" operation is performed: turn on the second switch transistor M2, the third switch transistor M3, the fourth switch transistor M4 and the fifth switch transistor M5, and turn off the first switch transistor M1, until the voltage on the BL and the voltage on the SABLB are equal and are at a high level and the voltage on the BLB and the voltage on the SABL are equal and are at a low level;
when a read "0" operation is performed: turn on the second switch transistor M2, the third switch transistor M3, the fourth switch transistor M4 and the fifth switch transistor M5, and turn off the first switch transistor M1, until the voltage on the BL and the voltage on the SABLB are equal and are at a low level and the voltage on the BLB and the voltage on the SABL are equal and are at a high level, so as to reach a stable state to complete restoration.

It should be noted that in FIG. 9, closed circuits formed after the second switch transistor M2, the third switch transistor M3, the fourth switch transistor M4 and the fifth switch transistor M5 are turned on are indicated by solid lines, and the second switch transistor M2, the third switch transistor M3, the fourth switch transistor M4 and the fifth switch transistor M5 are omitted. An open circuit formed after the first switch transistor M1 is turned off is indicated by a dotted line, and the first switch transistor M1 is omitted.

The sequential logic signals applied to the control terminals of the switch transistors in each stage in the control method of the sense amplifier provided in some embodiments will be described in detail below.

Figure 10:
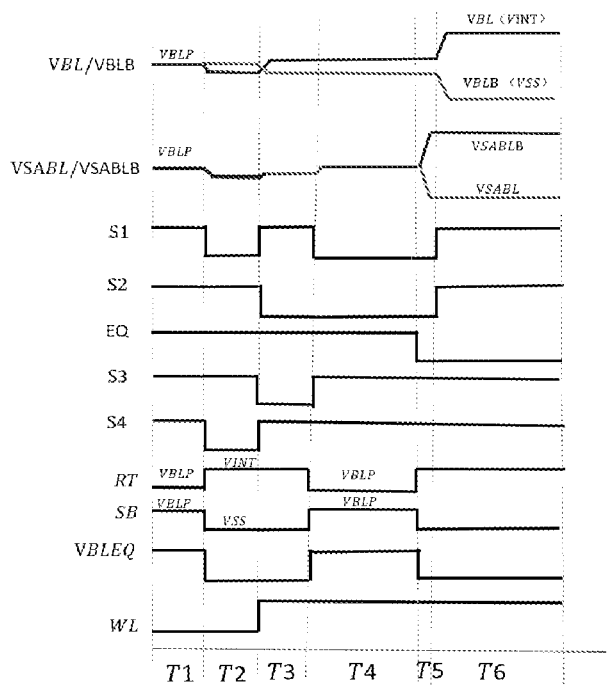
FIG. 10 is a sequential logic diagram for performing a read "1" operation in the control method of the sense amplifier according to an embodiment of the present disclosure.

First, take an example of performing a read "1" operation, as shown in FIG. 10, specifically:

Pre-charge stage (T1 stage): The equalization control signal EQ, the first control signal S1, the second control signal S2, the third control signal S3, the fourth control signal S4 and the bitline equalization voltage VBLEQ are at a high level. The voltage on the first power input terminal RT and the voltage on the second power input terminal SB are the bitline pre-charge voltage VBLP. The first switch transistor M1, the second switch transistor M2, the third switch transistor M3, the fourth switch transistor M4 and the fifth switch transistor M5 are turned on to pre-charge the BL, the BLB, the SABL and the SABLB. When the BL, the BLB, the SABL and the SABLB are charged to the pre-charge voltage VBLP, the pre-charge stage ends. In the pre-charge stage, the WL is at a low level, and the switch unit 1 is turned off.

First offset compensation stage (T2 stage): The equalization control signal EQ, the second control signal S2, and the third control signal S3 are at a high level, and the first control signal S1 and the fourth control signal S4 are at a low level. The voltage on the first power input terminal RT changes from the bitline pre-charge voltage VBLP to the supply voltage VINT, and the voltage on the second power input terminal SB changes from the bitline pre-charge voltage VBLP to the ground voltage VSS. The first switch transistor M1, the third switch transistor M3 and the fourth switch transistor M4 are turned on, and the second switch transistor M2 and the fifth switch transistor M5 are turned off. When the voltage on the BL and the voltage on the SABL are pulled to be equal, the first offset compensation stage ends. In the first offset compensation stage, the WL is at a low level, and the switch unit 1 remains off.

Second offset compensation and charge sharing stage (T3 stage): The equalization control signal EQ, the first control signal S1 and the fourth control signal S4 are at a high level, and the second control signal S2 and the third control signal S3 are at a low level. The voltage on the first power input terminal RT continues to be the supply voltage VINT, and the voltage on the second power input terminal SB continues to be the ground voltage VSS. The third switch transistor M3 and the fourth switch transistor M4 are turned off, and the first switch transistor M1, the second switch transistor M2 and the fifth switch transistor M5 are turned on. The voltage on the SABLB and the voltage on the BLB are pulled to the same voltage. The WL is at a high level, and the switch unit 1 is turned on. The charge in the energy storage unit 2 is shared with that in the BL. In this process, the data with a value of "1" is stored in the energy storage unit 2. During the charge sharing process, the voltage on the BL rises to a predetermined value. When the voltage on the SABLB is equal to that on the BLB, and the BL and the memory unit complete charge sharing, the second offset compensation and charge sharing stage ends.

In the sense amplifier of the present disclosure, due to manufacturing process and temperature changes, the first NMOS transistor N1 and the second NMOS transistor N2 may have different threshold voltages Vth. In this case, the sense amplifier causes offset noise due to the difference in the threshold voltages Vth of the first NMOS transistor N1 and the second NMOS transistor N2. By the first offset compensation and the second offset compensation, the offset noise can be effectively eliminated.

Equalization stage (T4 stage): The equalization control signal EQ, the third control signal S3, the fourth control signal S4 and the bitline equalization voltage VBLEQ are at a high level, and the first control signal S1 and the second control signal S2 are at a low level. The voltage on the first power input terminal RT changes from the supply voltage VINT to the bitline pre-charge voltage VBLP, and the voltage on the second power input terminal SB changes from the ground voltage VSS to the bitline pre-charge voltage VBLP. The first switch transistor M1, the fourth switch transistor M4 and the fifth switch transistor M5 are turned on, and the second switch transistor M2 and the third switch transistor M3 are turned off. The voltage on the SABL and the voltage on the SABLB are pulled to the bitline pre-charge voltage VBLP. When the voltage on the SABL is equal to the voltage on the SABLB, the equalization stage ends. In the equalization stage, the WL is at a high level, and the switch unit 1 remains on.

Pre-sensing stage (T5 stage): The third control signal S3 and the fourth control signal S4 are at a high level, and the equalization control signal EQ, the first control signal S1, the second control signal S2 and the bitline equalization voltage VBLEQ are at a low level. The voltage on the first power input terminal RT changes from the bitline pre-charge voltage VBLP to the supply voltage VINT, and the voltage on the second power input terminal SB changes from the bitline pre-charge voltage VBLP to the ground voltage VSS. The fourth switch transistor M4 and the fifth switch transistor M5 are turned on, and the first switch transistor M1, the second switch transistor M2 and the third switch transistor M3 are turned off. Since there is a sufficient difference between the voltage VBL on the BL and the voltage VBLB on the BLB, the sense amplifier starts to amplify. The voltage VSABL on the SABL is pulled down, and the voltage VSABLB on the SABLB is pulled up. When the voltage VSABL on the SABL is pulled down to the ground voltage VSS, and the voltage VSABLB on the SABLB is pulled up to the supply voltage VINT, the pre-sensing stage ends. In the pre-sensing stage, the WL is at a high level, and the switch unit 1 remains on.

restoring stage (T6 stage): The first control signal S1, the second control signal S2, the third control signal S3, and the fourth control signal S4 are at a high level, and the equalization control signal EQ and the bitline equalization voltage VBLEQ are at a low level. The voltage on the first power input terminal RT continues to be the supply voltage VINT, and the voltage on the second power input terminal SB continues to be the ground voltage VSS. The second switch transistor M2, the third switch transistor M3, the fourth switch transistor M4 and the fifth switch transistor M5 are respectively turned on, and the first switch transistor M1 is turned off. The voltage VSABLB on the SABLB is continued to be pulled up, and the voltage VSABL on the SABL is continued to be pulled down. When the second switch transistor M2 and the third switch transistor M3 are turned on, the voltage VSABLB on the SABLB is conducted to the BL, and the voltage VSABL on the SABL is conducted to the BLB. Thus, the voltage VSABLB on the SABLB and the voltage VBL on the BL are equal and are at a high level, and the voltage VSABL on the SABL and the voltage VBLB on the BLB are equal and are at a low level. A stable state is reached and the restoring stage ends. In the restoring stage, the WL is at a high level, and the switch unit 1 remains on.

Figure 11:
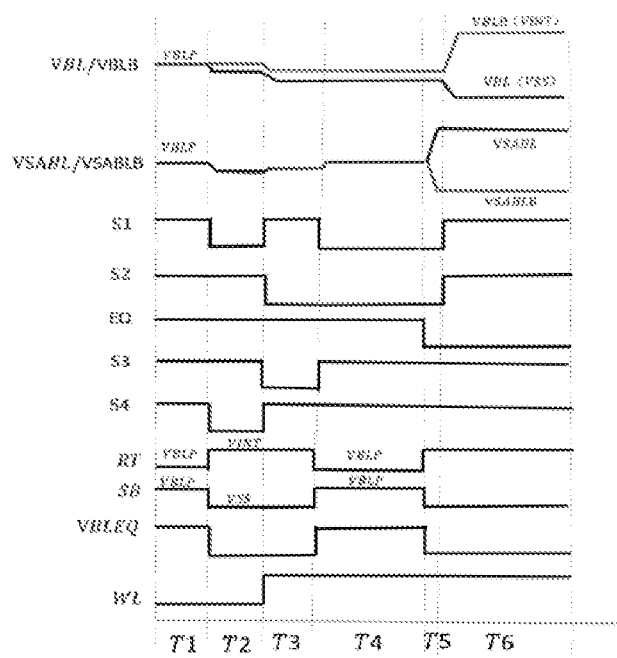
FIG. 11 is a sequential logic diagram for performing a read "0" operation in the control method of the sense amplifier according to an embodiment of the present disclosure.

Second, take an example of performing a read "0" operation, as shown in FIG. 11, which is specifically:

Pre-charge stage (T1 stage): The equalization control signal EQ, the first control signal S1, the second control signal S2, the third control signal S3, the fourth control signal S4 and the bitline equalization voltage VBLEQ are at a high level. The voltage on the first power input terminal RT and the voltage on the second power input terminal SB are a bitline pre-charge voltage VBLP. Therefore, the first switch transistor M1, the second switch transistor M2, the third switch transistor M3, the fourth switch transistor M4 and the fifth switch transistor M5 are turned on to pre-charge the BL, the BLB, the SABL and the SABLB. When the BL, the BLB, the SABL and the SABLB are charged to the pre-charge voltage VBLP, the pre-charge stage ends. In the pre-charge stage, the WL is at a low level, and the switch unit 1 is turned off.

First offset compensation stage (T2 stage): The equalization control signal EQ, the second control signal S2, and the third control signal S3 are at a high level, and the first control signal S1 and the fourth control signal S4 are at a low level. The voltage on the first power input terminal RT changes from the bitline pre-charge voltage VBLP to the supply voltage VINT, and the voltage on the second power input terminal SB changes from the bitline pre-charge voltage VBLP to the ground voltage VSS. The first switch transistor M1, the third switch transistor M3 and the fourth switch transistor M4 are turned on, and the second switch transistor M2 and the fifth switch transistor M5 are turned off. When the voltage on the BL and the voltage on the SABL are pulled to be equal, the first offset compensation stage ends. In the first offset compensation stage, the WL is at a low level, and the switch unit 1 remains off.

Second offset compensation and charge sharing stage (T3 stage): The equalization control signal EQ, the first control signal S1 and the fourth control signal S4 are at a high level, and the second control signal S2 and the third control signal S3 are at a low level. The voltage on the first power input terminal RT continues to be the supply voltage VINT, and the voltage on the second power input terminal SB continues to be the ground voltage VSS. The third switch transistor M3 and the fourth switch transistor M4 are turned off, and the first switch transistor M1, the second switch transistor M2 and the fifth switch transistor M5 are turned on. The voltage on the SABLB and the voltage on the BLB are pulled to the same voltage. The WL is at a high level, and the switch unit 1 is turned on. The charge in the energy storage unit 2 is shared with that of the BL. In this process, the data with a value of "0" is stored in the energy storage unit 2. During the charge sharing process, the voltage on the BL drops to a predetermined value. When the voltage on the SABLB is equal to that on the BLB, and the BL and the memory unit complete charge sharing, the second offset compensation and charge sharing stage ends.

Equalization stage (T4 stage): The equalization control signal EQ, the third control signal S3, the fourth control signal S4 and the bitline equalization voltage VBLEQ are at a high level, and the first control signal S1 and the second control signal S2 are at a low level. The voltage on the first power input terminal RT changes from the supply voltage VINT to the bitline pre-charge voltage VBLP, and the voltage on the second power input terminal SB changes from the ground voltage VSS to the bitline pre-charge voltage VBLP. The first switch transistor M1, the fourth switch transistor M4 and the fifth switch transistor M5 are turned on, and the second switch transistor M2 and the third switch transistor M3 are turned off. The voltage on the SABL and the voltage on the SABLB are pulled to the bitline pre-charge voltage VBLP. When the voltage on the SABL is equal to the voltage on the SABLB, the equalization stage ends. In the equalization stage, the WL is at a high level, and the switch unit 1 remains on.

Pre-sensing stage (T5 stage): The third control signal S3 and the fourth control signal S4 are at a high level, and the equalization control signal EQ, the first control signal S1, the second control signal S2 and the bitline equalization voltage VBLEQ are at a low level. The voltage on the first power input terminal RT changes from the bitline pre-charge voltage VBLP to the supply voltage VINT, and the voltage on the second power input terminal SB changes from the bitline pre-charge voltage VBLP to the ground voltage VSS. The fourth switch transistor M4 and the fifth switch transistor M5 are turned on, and the first switch transistor M1, the second switch transistor M2, and the third switch transistor M3 are turned off. Since there is a sufficient difference between the voltage VBL on the BL and the voltage VBLB on the BLB, The sense amplifier starts to amplify, the voltage VSABL on the SABL is pulled up, and the voltage VSABLB on the SABLB is pulled down. When the voltage VSABL on the SABL is pulled up to the supply voltage VINT, and the voltage VSABLB on the VSABL is pulled down to the ground voltage VSS, the pre-sensing stage ends. In the pre-sensing stage, the WL is at a high level, and the switch unit 1 remains on.

Restoring stage (T6 stage): The first control signal S1, the second control signal S2, the third control signal S3, and the fourth control signal S4 are at a high level, and the equalization control signal EQ is at a low level. The voltage on the first power input terminal RT continues to be the supply voltage VINT, and the voltage on the second power input terminal SB continues to be the ground voltage VSS. The second switch transistor M2, the third switch transistor M3, the fourth switch transistor M4 and the fifth switch transistor M5 are respectively turned on, and the first switch transistor M1 is turned off. The voltage VSABLB on the SABLB is continued to be pulled down, and the voltage VSABL on the SABL is continued to be pulled up. When the second switch transistor M2 and the third switch transistor M3 are turned on, the voltage VSABLB on the SABLB is conducted to the BL, and the voltage VSABL on the SABL is conducted to the BLB. Thus, the voltage VSABLB on the SABLB and the voltage VBL on the BL are equal and are at a low level, and the voltage VSABL on the SABL and the voltage VBLB on the BLB are equal and are at a high level. A stable state is reached and the restoring stage ends. In the restoring stage, the WL is at a high level, and the switch unit 1 remains on. In the restoring stage, the bitline equalization voltage VBLEQ is at a low level.

It should be noted that the high level and the low level mentioned in the above embodiments are both relative concepts, that is, the value of the high-level voltage is higher than that of the corresponding low-level voltage. The present disclosure does not limit the specific values of the high-level voltage and the low-level voltage. The present disclosure does not limit the high levels applied to different signal lines in this specific embodiment to be equal. For example, the high level on the BL and the high level on the WL may be different voltages. The present disclosure also does not limit the high level of a specific signal line at different stages to be equal. For example, the high level applied by the BL during write "1" and read operations may be different voltages. Those skilled in the art should understand that the corresponding high-level and low-level values may be set by themselves according to process nodes, speed requirements, reliability requirements, etc.

The present disclosure further provides a memory including the sense amplifier according to any one of the above-mentioned embodiments.

The present disclosure further provides a computer equipment. The computer equipment includes a memory and a processor, where the memory stores a computer program, and the computer program is executed by the processor to implement the steps of the control method of the sense amplifier according to any one of the above-mentioned embodiments.

The present disclosure further provides a computer-readable storage medium. The computer-readable storage medium stores a computer program, and the computer program is executed by a processor to implement the steps of the control method of the sense amplifier according to any one of the above-mentioned embodiments.

In the specification, the description of terms such as "one of the embodiments", "other embodiments" means that a specific feature, structure, material or characteristic described in combination with the embodiment(s) or example(s) are included in at least one embodiment or example of the present disclosure. In this specification, the schematic description of the above terms does not necessarily refer to the same embodiment or example.

The technical features of the above embodiments can be employed in arbitrary combinations. In order to make the description concise, all possible combinations of all technical features of the embodiments may not be described. However, these combinations of technical features should be construed as falling within the scope defined by the specification as long as no contradiction occurs.

Only several embodiments of the present disclosure are described in detail above, but they should not therefore be construed as limiting the scope of the present disclosure. It should be noted that those of ordinary skill in the art can further make variations and improvements without departing from the conception of the present disclosure. These variations and improvements all fall within the protection scope of the present disclosure. Therefore, the protection scope of the present disclosure should be subject to the protection scope defined by the claims.

The invention claimed is:

1. A sense amplifier, comprising: a first power input terminal, a second power input terminal, a first switch transistor, a second switch transistor, a third switch transistor, a fourth switch transistor, a fifth switch transistor, a first negative-channel metal-oxide semiconductor (NMOS) transistor, a second NMOS transistor, a first positive-channel metal-oxide semiconductor (PMOS) transistor and a second PMOS transistor, wherein
- a source of the first PMOS transistor and a source of the second PMOS transistor are connected to the first power input terminal of the sense amplifier; a drain of the first PMOS transistor and a gate of the second PMOS transistor are connected to a sensing bitline; a gate of the first PMOS transistor and a drain of the second PMOS transistor are connected to a complementary sensing bitline;
- a first terminal of the first switch transistor is connected to the sensing bitline, a second terminal of the first switch transistor is connected to the complementary sensing bitline, and a control terminal of the first switch transistor is connected to an equalization control signal;
- a first terminal of the second switch transistor is connected to a complementary bitline, a second terminal of the second switch transistor is connected to the sensing bitline, and a control terminal of the second switch transistor is connected to a first control signal;
- a first terminal of the third switch transistor is connected to a bitline, a second terminal of the third switch transistor is connected to the complementary sensing bitline, and a control terminal of the third switch transistor is connected to a second control signal;
- a first terminal of the fourth switch transistor is connected to the sensing bitline, a second terminal of the fourth switch transistor is connected to a drain of the first NMOS transistor, and a control terminal of the fourth switch transistor is connected to a third control signal;
- a first terminal of the fifth switch transistor is connected to the complementary sensing bitline, a second terminal of the fifth switch transistor is connected to a drain of the second NMOS transistor, and a control terminal of the fifth switch transistor is connected to a fourth control signal; and
- a source of the first NMOS transistor and a source of the second NMOS transistor are connected to the second power input terminal of the sense amplifier; a gate of the first NMOS transistor is connected to the bitline, and a gate of the second NMOS transistor is connected to the complementary bitline.

2. The sense amplifier according to claim 1, wherein each of the first switch transistor, the second switch transistor, the third switch transistor, the fourth switch transistor and the fifth switch transistor is an NMOS transistor; each of the first terminal of the first switch transistor, the first terminal of the second switch transistor, the first terminal of the third switch transistor, the first terminal of the fourth switch transistor and the first terminal of the fifth switch transistor is a drain of an NMOS transistor; each of the second terminal of the first switch transistor, the second terminal of the second switch transistor, the second terminal of the third switch transistor, the second terminal of the fourth switch transistor and the second terminal of the fifth switch transistor is a source of an NMOS transistor; each of the control terminal of the first switch transistor, the control terminal of the second switch transistor, the control terminal of the third switch transistor, the control terminal of the fourth switch transistor and the control terminal of the fifth switch transistor is a gate of an NMOS transistor.

3. The sense amplifier according to claim 1, wherein the sense amplifier is connected to an energy storage unit by a switch unit.

4. The sense amplifier according to claim 3, wherein the switch unit comprises a sixth switch transistor; a control terminal of the sixth switch transistor is connected to a wordline, a first terminal of the sixth switch transistor is connected to the energy storage unit, and a second terminal of the sixth switch transistor is connected to the bitline.

5. The sense amplifier according to claim 4, wherein one terminal of the energy storage unit is connected to an applied voltage, and a second terminal of the energy storage unit is connected to the first terminal of the sixth switch transistor.

6. The sense amplifier according to claim 5, wherein the applied voltage is half of a supply voltage.

7. The sense amplifier according to claim 5, wherein the energy storage unit comprises an energy storage capacitor.

8. The sense amplifier according to claim 4, wherein the sixth switch transistor comprises an NMOS transistor; a drain of the sixth switch transistor is the first terminal of the sixth switch transistor, a source of the sixth switch transistor is the second terminal of the sixth switch transistor, and a gate of the sixth switch transistor is the control terminal of the sixth switch transistor.

9. The sense amplifier according to claim 1, wherein the sense amplifier further comprises a seventh switch transistor; a first terminal of the seventh switch transistor is connected to a bitline pre-charge voltage, a second terminal of the seventh switch transistor is connected to the complementary sensing bitline, and a control terminal of the seventh switch transistor is connected to a bitline equalization voltage.

10. The sense amplifier according to claim 9, wherein the seventh switch transistor comprises an NMOS transistor; a drain of the seventh switch transistor is the first terminal of the seventh switch transistor, a source of the seventh switch transistor is the second terminal of the seventh switch transistor, and a gate of the seventh switch transistor is the control terminal of the seventh switch transistor.

11. A control method of a sense amplifier, wherein the sense amplifier comprises:
- a first power input terminal, a second power input terminal, a first switch transistor, a second switch transistor, a third switch transistor, a fourth switch transistor, a fifth switch transistor, a first negative-channel metal-oxide semiconductor (NMOS) transistor, a second NMOS transistor, a first positive-channel metal-oxide semiconductor (PMOS) transistor and a second PMOS transistor, wherein
    - a source of the first PMOS transistor and a source of the second PMOS transistor are connected to the first power input terminal of the sense amplifier; a drain of the first PMOS transistor and a gate of the second PMOS transistor are connected to a sensing bitline; a gate of the first PMOS transistor and a drain of the second PMOS transistor are connected to a complementary sensing bitline;
    - a first terminal of the first switch transistor is connected to the sensing bitline, a second terminal of the first switch transistor is connected to the complementary sensing bitline, and a control terminal of the first switch transistor is connected to an equalization control signal;

a first terminal of the second switch transistor is connected to a complementary bitline, a second terminal of the second switch transistor is connected to the sensing bitline, and a control terminal of the second switch transistor is connected to a first control signal;
a first terminal of the third switch transistor is connected to a bitline, a second terminal of the third switch transistor is connected to the complementary sensing bitline, and a control terminal of the third switch transistor is connected to a second control signal;
a first terminal of the fourth switch transistor is connected to the sensing bitline, a second terminal of the fourth switch transistor is connected to a drain of the first NMOS transistor, and a control terminal of the fourth switch transistor is connected to a third control signal;
a first terminal of the fifth switch transistor is connected to the complementary sensing bitline, a second terminal of the fifth switch transistor is connected to a drain of the second NMOS transistor, and a control terminal of the fifth switch transistor is connected to a fourth control signal; and
a source of the first NMOS transistor and a source of the second NMOS transistor are connected to the second power input terminal of the sense amplifier; a gate of the first NMOS transistor is connected to the bitline, and a gate of the second NMOS transistor is connected to the complementary bitline;
the control method of the sense amplifier sequentially comprises: a pre-charge stage, a first offset compensation stage, a second offset compensation and charge sharing stage, an equalization stage, a pre-sensing stage and a restoring stage; wherein
the pre-charge stage comprises: turning on the first switch transistor, the second switch transistor, the third switch transistor, the fourth switch transistor and the fifth switch transistor, until a voltage on the bitline, a voltage on the complementary bitline, a voltage on the sensing bitline and a voltage on the complementary sensing bitline are equal to a bitline pre-charge voltage, so as to complete pre-charge;
the first offset compensation stage comprises: turning on the first switch transistor, the third switch transistor and the fourth switch transistor, and turning off the second switch transistor and the fifth switch transistor, until the voltage on the bitline is equal to the voltage on the sensing bitline, so as to complete a first offset compensation;
the second offset compensation and charge sharing stage comprises: turning off the third switch transistor and the fourth switch transistor, and turning on the first switch transistor, the second switch transistor and the fifth switch transistor, until the voltage on the complementary sensing bitline is equal to the voltage on the complementary bitline, and the bitline and a memory unit complete charge sharing, so as to complete a second offset compensation and charge sharing;
the equalization stage comprises: turning on the first switch transistor, the fourth switch transistor and the fifth switch transistor, and turning off the second switch transistor and the third switch transistor, until the voltage on the sensing bitline is equal to the voltage on the complementary sensing bitline, so as to complete equalization;
the pre-sensing stage comprises: turning on the fourth switch transistor and the fifth switch transistor, and turning off the first switch transistor, the second switch transistor and the third switch transistor, until the voltage on the sensing bitline is pulled to be equal to a voltage on the second power input terminal, and the voltage on the complementary sensing bitline is pulled to be equal to a voltage on the first power input terminal, or until the voltage on the sensing bitline is pulled to be equal to the voltage on the first power input terminal, and the voltage on the complementary sensing bitline is pulled to be equal to the voltage on the second power input terminal, so as to complete pre-sensing; and
the restoring stage comprises: turning on the second switch transistor, the third switch transistor, the fourth switch transistor and the fifth switch transistor, and turning off the first switch transistor, until the voltage on the bitline and the voltage on the complementary sensing bitline are equal and are at a high level, and the voltage on the complementary bitline and the voltage on the sensing bitline are equal and are at a low level, or until the voltage on the bitline and the voltage on the complementary sensing bitline are equal and are at the low level, and the voltage on the complementary bitline and the voltage on the sensing bitline are equal and are at the high level, so as to reach a stable state to complete restoration.

12. The control method according to claim 11, wherein
in the pre-charge stage, the equalization control signal, the first control signal, the second control signal, the third control signal and the fourth control signal are at the high level; the voltage on the first power input terminal and the voltage on the second power input terminal are the bitline pre-charge voltage; a wordline is at the low level;
in the first offset compensation stage, the equalization control signal, the second control signal and the third control signal are at the high level; the first control signal and the fourth control signal are at the low level; the voltage on the first power input terminal is a supply voltage, and the voltage on the second power input terminal is a ground voltage; the wordline is at the low level;
in the second offset compensation and charge sharing stage, the equalization control signal, the first control signal and the fourth control signal are at the high level, and the second control signal and the third control signal are at the low level; the voltage on the first power input terminal is the supply voltage, and the voltage on the second power input terminal is the ground voltage; the wordline is at the high level;
in the equalization stage, the equalization control signal, the third control signal and the fourth control signal are at the high level, and the first control signal and the second control signal are at the low level; the voltage on the first power input terminal and the voltage on the second power input terminal are the bitline pre-charge voltage; the wordline is at the high level;
in the pre-sensing stage, the third control signal and the fourth control signal are at the high level, and the equalization control signal, the first control signal and the second control signal are at the low level; the voltage on the first power input terminal is the supply voltage, and the voltage on the second power input terminal is the ground voltage; the wordline is at the high level; and in the restoring stage, the first control signal, the second control signal, the third control signal and the fourth control signal are at the high level, and the equalization control signal is at the low level; the voltage on the first power input terminal is the supply voltage, and the voltage on the second power input terminal is the ground voltage; the wordline is at the high level.

13. A computer equipment, comprising a memory and a processor, wherein the memory stores a computer program, and the computer program is executed by the processor to implement steps of a control method of a sense amplifier, wherein the sense amplifier comprises:

a first power input terminal, a second power input terminal, a first switch transistor, a second switch transistor, a third switch transistor, a fourth switch transistor, a fifth switch transistor, a first negative-channel metal-oxide semiconductor (NMOS) transistor, a second NMOS transistor, a first positive-channel metal-oxide semiconductor (PMOS) transistor and a second PMOS transistor, wherein a source of the first PMOS transistor and a source of the second PMOS transistor are connected to the first power input terminal of the sense amplifier; a drain of the first PMOS transistor and a gate of the second PMOS transistor are connected to a sensing bitline; a gate of the first PMOS transistor and a drain of the second PMOS transistor are connected to a complementary sensing bitline;

a first terminal of the first switch transistor is connected to the sensing bitline, a second terminal of the first switch transistor is connected to the complementary sensing bitline, and a control terminal of the first switch transistor is connected to an equalization control signal;

a first terminal of the second switch transistor is connected to a complementary bitline, a second terminal of the second switch transistor is connected to the sensing bitline, and a control terminal of the second switch transistor is connected to a first control signal;

a first terminal of the third switch transistor is connected to a bitline, a second terminal of the third switch transistor is connected to the complementary sensing bitline, and a control terminal of the third switch transistor is connected to a second control signal;

a first terminal of the fourth switch transistor is connected to the sensing bitline, a second terminal of the fourth switch transistor is connected to a drain of the first NMOS transistor, and a control terminal of the fourth switch transistor is connected to a third control signal;

a first terminal of the fifth switch transistor is connected to the complementary sensing bitline, a second terminal of the fifth switch transistor is connected to a drain of the second NMOS transistor, and a control terminal of the fifth switch transistor is connected to a fourth control signal; and a source of the first NMOS transistor and a source of the second NMOS transistor are connected to the second power input terminal of the sense amplifier; a gate of the first NMOS transistor is connected to the bitline, and a gate of the second NMOS transistor is connected to the complementary bitline;

the control method of the sense amplifier sequentially comprises: a pre-charge stage, a first offset compensation stage, a second offset compensation and charge sharing stage, an equalization stage, a pre-sensing stage and a restoring stage;

the pre-charge stage comprises: turning on the first switch transistor, the second switch transistor, the third switch transistor, the fourth switch transistor and the fifth switch transistor, until a voltage on the bitline, a voltage on the complementary bitline, a voltage on the sensing bitline and a voltage on the complementary sensing bitline are equal to a bitline pre-charge voltage, so as to complete pre-charge;

the first offset compensation stage comprises: turning on the first switch transistor, the third switch transistor and the fourth switch transistor, and turning off the second switch transistor and the fifth switch transistor, until the voltage on the bitline is equal to the voltage on the sensing bitline, so as to complete a first offset compensation;

the second offset compensation and charge sharing stage comprises: turning off the third switch transistor and the fourth switch transistor, and turning on the first switch transistor, the second switch transistor and the fifth switch transistor, until the voltage on the complementary sensing bitline is equal to the voltage on the complementary bitline, and the bitline and a memory unit complete charge sharing, so as to complete a second offset compensation and charge sharing;

the equalization stage comprises: turning on the first switch transistor, the fourth switch transistor and the fifth switch transistor, and turning off the second switch transistor and the third switch transistor, until the voltage on the sensing bitline is equal to the voltage on the complementary sensing bitline, so as to complete equalization;

the pre-sensing stage comprises: turning on the fourth switch transistor and the fifth switch transistor, and turning off the first switch transistor, the second switch transistor and the third switch transistor, until the voltage on the sensing bitline is pulled to be equal to a voltage on the second power input terminal, and the voltage on the complementary sensing bitline is pulled to be equal to a voltage on the first power input terminal, or until the voltage on the sensing bitline is pulled to be equal to the voltage on the first power input terminal, and the voltage on the complementary sensing bitline is pulled to be equal to the voltage on the second power input terminal, so as to complete pre-sensing; and the restoring stage comprises: turning on the second switch transistor, the third switch transistor, the fourth switch transistor and the fifth switch transistor, and turning off the first switch transistor, until the voltage on the bitline and the voltage on the complementary sensing bitline are equal and are at a high level, and the voltage on the complementary bitline and the voltage on the sensing bitline are equal and are at a low level, or until the voltage on the bitline and the voltage on the complementary sensing bitline are equal and are at the low level, and the voltage on the complementary bitline and the voltage on the sensing bitline are equal and are at the high level, so as to reach a stable state to complete restoration.

* * * * *